United States Patent
Liston

(10) Patent No.: US 7,554,841 B2
(45) Date of Patent: Jun. 30, 2009

(54) CIRCUIT FOR STORING INFORMATION IN AN INTEGRATED CIRCUIT AND METHOD THEREFOR

(75) Inventor: Thomas W. Liston, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 61 days.

(21) Appl. No.: 11/534,715

(22) Filed: Sep. 25, 2006

(65) Prior Publication Data

US 2008/0073722 A1 Mar. 27, 2008

(51) Int. Cl.
*G11C 11/00* (2006.01)
(52) U.S. Cl. .................. 365/185.01; 365/154; 365/227
(58) Field of Classification Search ............ 365/185.01, 365/154

See application file for complete search history.

(56) References Cited

U.S. PATENT DOCUMENTS 6,040,991 A * 3/2000 Ellis-Monaghan et al. .. 365/154
6,122,191 A * 9/2000 Hirose et al. ............ 365/185.01
6,363,011 B1 * 3/2002 Hirose et al. ............ 365/185.07
6,639,827 B2 * 10/2003 Clark et al. .................. 365/154
6,654,277 B1 * 11/2003 Hsu et al. .................... 365/154
6,774,696 B2 * 8/2004 Clark et al. .................. 327/333
7,161,827 B2 * 1/2007 Ramaraju et al. ........... 365/154
7,167,392 B1 * 1/2007 Poplevine et al. ...... 365/185.08
7,239,558 B1 * 7/2007 Poplevine et al. ........... 365/188
2003/0052371 A1 3/2003 Matsuzaki et al.
2006/0152255 A1 7/2006 Wang et al.

* cited by examiner

*Primary Examiner*—Vibol Tan
(74) *Attorney, Agent, or Firm*—Susan C. Hill

(57) ABSTRACT

A circuit has a storing portion, a write portion and a read portion. In one embodiment, read portion has a transistor which has a substantially thinner gate oxide than the transistors in the storing portion and the transistors in the write portion. In an alternate embodiment, circuit has a plurality of read ports. In an alternate embodiment, selecting the optimal gate oxide thickness for the transistors in circuit allows the trade-off between transistor switching speed and gate leakage current to be optimized to produce a circuit having a fast enough read access time and a low enough standby power.

20 Claims, 1 Drawing Sheet

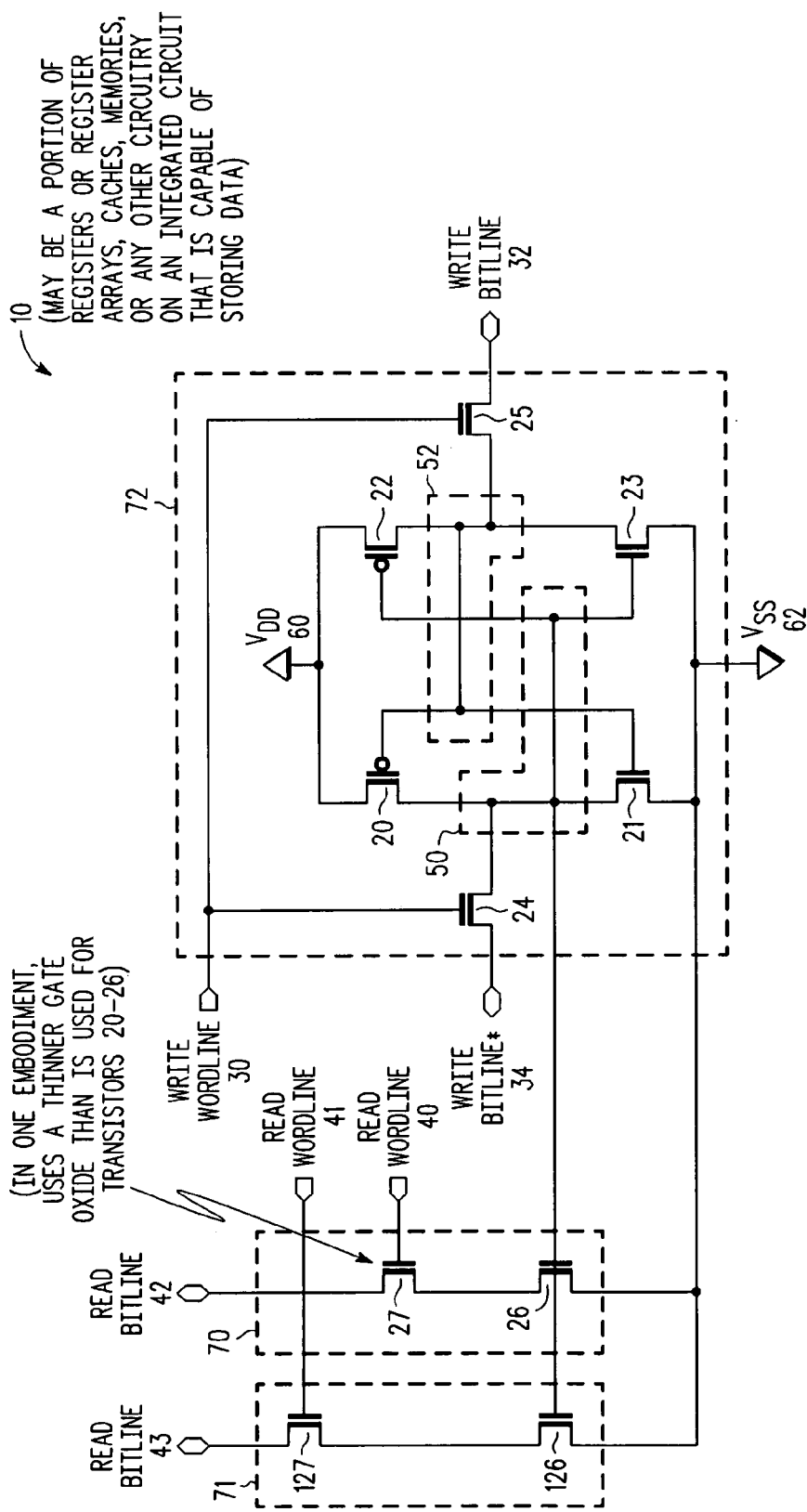
*FIGURE*

CIRCUIT FOR STORING INFORMATION IN AN INTEGRATED CIRCUIT AND METHOD THEREFOR

FIELD OF THE INVENTION

The invention relates in general to a circuit, and more particularly to a circuit for storing information in an integrated circuit.

RELATED ART

It is common for devices using integrated circuits to continually require improved performance from the integrated circuits. As one example, it may be desirable for an integrated circuit used in a cell phone to retain data longer, use less power, and to also perform operations more quickly. However, it may be difficult to provide circuitry that achieves all of these goals without increasing the area and thus the cost of the integrated circuits.

BRIEF DESCRIPTION OF THE DRAWINGS

The present invention is illustrated by way of example and not limited by the accompanying figures, in which like references indicate similar elements, and in which:

FIGURE illustrates, in schematic diagram form, a circuit 10 in accordance with one embodiment.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The terms "assert" and "negate" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

FIGURE illustrates, in schematic diagram form, a circuit 10 in accordance with one embodiment. In the illustrated embodiment, circuit 10 comprises a storing portion comprising transistors 20-23, a writing portion comprising transistors 24 and 25, and a reading portion comprising transistors 26 and 27, and 126 and 127.

In the illustrated embodiment, transistors 20-23 comprise a cross-coupled latch. Alternate embodiments may use more, less, or different circuitry to form the storing portion. In the illustrated embodiment, the storing portion comprises a p-channel transistor 20 having a first current electrode coupled to a first power supply voltage (VDD 60), having a second current electrode coupled to a node 50, and having a control electrode coupled to a node 52. The illustrated storing portion also comprises a p-channel transistor 22 having a first current electrode coupled to the first power supply voltage (VDD 60), having a second current electrode coupled to node 52, and having a control electrode coupled to node 50. The illustrated storing portion also comprises an n-channel transistor 21 having a first current electrode coupled to node 50, having a second current electrode coupled to a second power supply voltage (VSS 62), and having a control electrode coupled to node 52. The illustrated storing portion also comprises an n-channel transistor 23 having a first current electrode coupled to node 52, having a second current electrode coupled to the second power supply voltage (VSS 62), and having a control electrode coupled to node 50.

In the illustrated embodiment, the writing portion comprises two transistors 24 and 25. Alternate embodiments may use more, less, or different circuitry to form the writing portion. In the illustrated embodiment, the writing portion comprises an n-channel transistor 24 having a first current electrode coupled to a write bitline* 34 conductor for communicating a write bitline* 34 signal. The n-channel transistor 24 also has a second current electrode coupled to node 50, and a control electrode coupled to a write wordline 30 conductor for communicating a write wordline 30 signal. The writing portion also comprises an n-channel transistor 25 having a second current electrode coupled to a write bitline 32 conductor for communicating a write bitline 32 signal. The n-channel transistor 25 also has a first current electrode coupled to node 52, and a control electrode coupled to a write wordline 30 conductor for communicating a write wordline 30 signal. Circuit portion 72 comprises transistors 20-25 which are used for storing and writing.

In the illustrated embodiment, the reading portion 70 of circuit 10 comprises two transistors 26 and 27. Alternate embodiments may use more, less, or different circuitry to form the reading portion. In the illustrated embodiment, the reading portion comprises an n-channel transistor 27 having a first current electrode coupled to a read bitline 42 conductor for communicating a read bitline 42 signal. In addition, the n-channel transistor 27 has a control electrode coupled to a read wordline 40 conductor for communicating a read wordline 40 signal. N-channel transistor 27 also has a second current electrode coupled to a first current electrode of an n-channel transistor 26. N-channel transistor 26 has a second current electrode coupled to the second power supply voltage (VSS 62), and a control electrode coupled to node 50.

In the illustrated embodiment of circuit 10, transistors 24 and 25 comprise a write port and transistors 26 and 27 comprise a read port 70. In an alternate embodiment of circuit 10, circuit 10 may comprise a second read port 71. In this alternate embodiment, read port 71 may comprise an n-channel transistor 127 having a first current electrode coupled to a read bitline 43 conductor for communicating a read bitline 43 signal. In addition, the n-channel transistor 127 has a control electrode coupled to a read wordline 41 conductor for communicating a read wordline 41 signal. N-channel transistor 127 also has a second current electrode coupled to a first current electrode of an n-channel transistor 126. N-channel transistor 126 has a second current electrode coupled to the second power supply voltage (VSS 62), and a control electrode coupled to node 50. Some embodiments may not use a second read port 71.

FIGURE illustrates a circuit 10 that may be used to store (e.g. write) and retrieve (e.g. read) data. Such a circuit 10 may be used for a variety of purposes in an integrated circuit. For example, circuit 10 may be used in an array to compactly store a plurality of data values. Some possible application that may use circuit 10 are registers or register arrays, caches, memories, or any other circuitry on an integrated circuit that is capable of storing data. Thus circuit 10 may be a portion of registers or register arrays, caches, memories, or any other circuitry on an integrated circuit that is capable of storing data.

One problem that has arisen as dimensions in integrated circuits have been reduced is that the thinner gate oxide thicknesses used in smaller transistors have resulted in an increased gate leakage current. For some circuits this increased gate leakage is not a problem. However, for other circuits, increased gate leakage is a significant problem. One such circuit that is significantly impacted by gate leakage is a prior art circuit (not shown) that has the same schematic representation as the circuit 10 in FIGURE, but which uses approximately the same oxide thicknesses for all transistors.

This prior art circuit forces tradeoffs to be made between speed and standby power. In the past, it was common to power down many portions of an integrated circuit that were not currently being used in order to save power. This is especially important in applications that use a battery to provide power to the integrated circuits. However, when many portions of the integrated circuit are frequently powered down, the performance of the integrated circuit may be degraded due to the time required to power up the integrated circuit portions before they are capable of being used. As a result, some circuitry may not be powered down as often, and the standby power used by this circuitry has become even more important in some applications. Standby power is the power required by circuitry to retain data and state information when the circuitry is powered up but is not actively being used.

Unfortunately, techniques used to reduce standby power may also reduce performance. For example, the prior art circuit (not shown) that has the same schematic representation as the circuit 10 in FIGURE but which uses substantially the same oxide thicknesses for all transistors has a significant problem. As the dimensions of the transistors are reduced and the gate oxides become thinner, the gate leakage current of the transistors increases. The prior art circuit (not shown) that has the same schematic representation as the circuit 10 in FIGURE but which uses substantially the same oxide thicknesses for all transistors now has a significant problem.

The circuit 10 illustrated in FIGURE solves this problem. Circuit 10 allows both high read access speed and low standby power. This is a significant advantage. In one embodiment, circuit 10 uses a thinner gate oxide for transistor 27 than is used for transistors 20-26. In one embodiment, circuit 10 uses a substantially thinner gate oxide for transistor 27 than is used for transistors 20-26. In one embodiment, the gate oxide used for transistor 27 may be less than or equal to ¾ the thickness of the gate oxide used for transistors 20-26. In an alternate embodiment, the gate oxide used for transistor 27 may be less than or equal to ⅚ the thickness of the gate oxide used for transistors 20-26. In another alternate embodiment, the gate oxide used for transistor 27 may be less than or equal to ⅔ the thickness of the gate oxide used for transistors 20-26. In one embodiment, the gate oxide thickness used for transistor 27 may be less than or equal to 1.3 nanometers and the gate oxide thickness used for transistors 20-26 may be greater than or equal to 1.8 nanometers. In an alternate embodiment, the gate oxide thickness used for transistor 27 may be less than or equal to 1.5 nanometers and the gate oxide thickness used for transistors 20-26 may be greater than or equal to 1.6 nanometers. In another alternate embodiment, the gate oxide thickness used for transistor 27 may be less than or equal to 1.4 nanometers and the gate oxide thickness used for transistors 20-26 may be greater than or equal to 1.7 nanometers.

The effect of varying oxide thicknesses on the function of circuit 10 will now be described. In the illustrated embodiment, circuit 10 uses a plurality of transistors 20-23 to store a data bit. Transistors 24 and 25 may be used to allow the data bit to be selectively written. Transistors 26 and 27 may be used to allow the data bit to be selectively read. A significant problem arises if all of the transistors in circuit 10 use approximately the same gate oxide thickness. If the transistors 20-23 used to store data and the transistors 24, 25 used to write data have low enough gate leakage (e.g. by using thicker gate oxide), then the transistors used in the read path will be made slower by using this thicker gate oxide. As a result, the access time to read the data bit stored in circuit 10 will be longer. This is usually undesirable. However, if a thinner gate oxide is used to increase the switching speed of the transistors (e.g. 27) in the read path to improve read access time, then the transistors (e.g. 27) in the read path will be fast, but the transistors used to store data 20-23 and the transistors used to write data 24, 25 will now have a larger gate leakage current. This larger gate leakage current may cause the standby power used by the circuit 10 to increase. This is usually undesirable.

One possible solution is to carefully select certain transistors in circuit 10 to use thinner gate oxide, while carefully selecting which transistors in circuit 10 will use thicker oxide. The actual values of the gate oxide thicknesses, as well as the relationships between the gate oxide thicknesses used will affect the performance of circuit 10.

In one embodiment, transistor 27 is selected to have a gate oxide thickness substantially less than the gate oxide thicknesses of transistors 20-26. As a result, the switching speed of transistor 27 is significantly faster than the switching speed of transistors 20-26. Thus, as transistor 27 is required to switch during a read access, a read access to circuit 10 by way of transistor 27 and read bitline 42 will be faster. Fortunately, circuit 10 may be designed in such a manner that the increased gate leakage current of transistor 27 does not degrade the performance of circuit 10. For example, in one embodiment, the read bitline 42 is either driven to approximately VSS 62 or allowed to float to approximately VSS 62 when a read access is not occurring. Similarly, the read wordline 40 is either driven to approximately VSS 62 or allowed to float to approximately VSS 62 when a read access is not occurring. This results in a minimal amount of leakage current being provided by transistor 27. As a result, the standby power required by circuit 10 is not increased by using a thinner gate oxide for transistor 27.

Note that using a thicker gate oxide for transistor 26 will not significantly slow the read access time of circuit 10. This is because the control electrode of transistor 26 is already stable at either a high or low voltage (i.e. either a logic level "1" or a logic level "0") and transistor 26 is thus not switching during a read access.

The operation of one embodiment of circuit 10 will now be discussed. In the illustrated embodiment, circuit 10 is written by asserting write wordline 30 and by driving write bitline 32 to the true data value and driving write bitline* 34 to the complement of the true data value. As a result, the true data value is latched and held or stored by transistors 20-23. It is generally desirable to use thicker gate oxide thicknesses for transistors 20-25 so that the gate leakage current is minimized. Minimizing the gate leakage current of transistors 20-25 has the effect of minimizing the standby power required by circuit 10. If the gate leakage current of transistors 20-25 is large enough, circuit 10 may even have problems retaining the data value stored by transistors 20-23.

In the illustrated embodiment, circuit 10 is read by asserting read wordline 40 and by selectively discharging read bitline 42. If a high voltage (e.g. logic level "1") is provided from transistors 20-23 to the control electrode of transistor 26, then a low voltage (e.g. logic level "0") is provided onto read bitline 42. As a result, the true data value (e.g. logic level "0") is read and provided on read bitline 42 by transistors 26 and 27. If a low voltage (e.g. logic level "0") is provided from transistors 20-23 to the control electrode of transistor 26, then no current is provided to read bitline 42 and read bitline 42 remains unchanged (normally at its precharged high level). As a result, the true data value (e.g. logic level "1") is read and provided on read bitline 42 because transistors 26 is non-conducting and transistor 27 is conducting.

In the illustrated embodiment, the portion of circuit 10 used for write accesses (transistors 24 and 25) uses differential data on write bitline 32 and write bitline* 34 for writing. Alternate embodiments may instead use only write bitline 32 or write bitline* 34 for writing (e.g. single-ended circuitry).

In the illustrated embodiment, the portion of circuit 10 used for read accesses (transistors 26 and 27) uses single-ended data on read bitline 42 for reading. Alternate embodiments may instead use differential read bitlines (e.g. read bitline 42 and read bitline* (not shown)) for read accesses.

Although the embodiment of circuit 10 illustrated in FIGURE uses one write port and one read port, alternate embodiments may use any number of read ports and may use any number of write ports. Note that in the illustrated embodiment, transistors 26 and 27 are part of the read port. Alternate embodiments may have a plurality of transistors like transistor 27, which have their second current electrodes coupled together, but having separate read wordlines and separate read bitlines 42. In another alternate embodiment, a plurality of transistors like transistors 26 and 27 may be arranged where the second current electrode of the transistors corresponding to transistor 26 are coupled to VSS 62, the gate electrode of the transistors corresponding to transistor 26 are coupled together, but separate read wordlines and separate read bitlines 42 are used for each stage. Alternately, transistors 26 and 27 may be moved and connected to node 52 instead of 50 and to read bitline* (not shown) instead of read bitline 42.

In the illustrated embodiment of circuit 10, the circuit portion 72 of circuit 10 comprises a storing portion (e.g. transistors 20-23) and a writing portion (e.g. transistors 24, 25). Alternate embodiments may use fewer or more transistors and/or may use a different circuit configuration for circuit portion 72. In addition, for embodiments of circuit 10 that have a plurality of read ports, only one or a portion of the read ports may use a transistor which has a thinner gate oxide. Some of the read ports may still use a thicker gate oxide if speed is not an issue and/or if higher voltages are being used with that port.

Statement 1. A method for providing an integrated circuit, the integrated circuit having a circuit for storing information, the method comprising:
  providing a storing portion of the circuit which stores information, the storing portion comprising a first transistor;
  providing a write portion of the circuit which provides the information to be written to the storing portion, the write portion comprising a second transistor; and
  providing a read portion of the circuit which receives the information to be read from the storing portion, the read portion comprising a third transistor,
  wherein a gate oxide thickness of the third transistor is substantially less than a gate oxide thickness of the first transistor.

Statement 2. A method as in statement 1, wherein a ratio of the gate oxide thickness of the third transistor to the gate oxide thickness of the first transistor is less than or equal to 5/6.

Statement 3. A method as in statement 1, wherein a ratio of the gate oxide thickness of the third transistor to the gate oxide thickness of the first transistor is less than or equal to 3/4.

Statement 4. A method as in statement 1, wherein the gate oxide thickness of the third transistor is less than or equal to 1.4 nanometers, and the gate oxide thickness of the first transistor is greater than or equal to 1.7 nanometers.

Statement 5. A method as in statement 1, wherein the gate oxide thickness of the third transistor is substantially less than a gate oxide thickness of the second transistor.

Statement 6. A method as in statement 1, wherein the integrated circuit comprises a cache, and wherein the cache comprises the circuit.

Statement 7. A method as in statement 1, wherein the integrated circuit comprises a register array, and wherein the register array comprises the circuit.

Statement 8. A method as in statement 1, wherein the read portion comprises a fourth transistor, and wherein a gate oxide thickness of the fourth transistor is substantially less than the gate oxide thickness of the first transistor.

Statement 9. A circuit, comprising:
  a cross-coupled latch which stores information, the cross-coupled latch comprising a first plurality of transistors;
  a differential write port, coupled to the cross-coupled latch, the differential write port being used to write a data value to the cross-coupled latch, the differential write port comprising a write transistor; and
  a single-ended read port, coupled to the cross-coupled latch, the single-ended read port being used to read the data value from the cross-coupled latch, the single-ended read port comprising a read transistor,
  wherein a gate oxide thickness of the read transistor is substantially less than a gate oxide thickness of at least one of the plurality of transistors.

Statement 10. A circuit as in statement 9, comprising:
  an additional read port coupled to the cross-coupled latch, the additional read port being used to read the data value from the cross-coupled latch, the additional read port comprising an additional read transistor, wherein a gate oxide thickness of the additional read transistor is substantially less than the gate oxide thickness of the at least one of the plurality of transistors.

Statement 11. A circuit as in statement 9, wherein a ratio of the gate oxide thickness of the read transistor to the gate oxide thickness of the at least one of the plurality of transistors is less than or equal to 5/6.

Statement 12. A circuit as in statement 9, wherein a ratio of the gate oxide thickness of the read transistor to the gate oxide thickness of the at least one of the plurality of transistors is less than or equal to 3/4.

Statement 13. A circuit as in statement 9, wherein the gate oxide thickness of the read transistor is substantially less than a gate oxide thickness of the write transistor.

Statement 14. An integrated circuit comprising a cache, wherein the cache comprises the circuit as in statement 9.

Statement 15. An integrated circuit comprising a register, wherein the register comprises the circuit as in statement 9.

Statement 16. An integrated circuit having a circuit for storing information, the circuit for storing information comprising:
  a storing portion which stores the information, the storing portion comprising a first transistor;
  a write portion which provides the information to be written to the storing portion, the write portion comprising a second transistor; and
  a read portion which receives the information to be read from the storing portion, the read portion comprising a third transistor,
  wherein a gate oxide thickness of the third transistor is substantially less than a gate oxide thickness of the first transistor.

Statement 17. An integrated circuit as in statement 16, wherein a ratio of the gate oxide thickness of the third transistor to the gate oxide thickness of the first transistor is less than or equal to 5/6.

Statement 18. An integrated circuit as in statement 16, wherein a ratio of the gate oxide thickness of the third transistor to the gate oxide thickness of the first transistor is less than or equal to 3/4.

Statement 19. An integrated circuit as in statement 16, wherein the gate oxide thickness of the third transistor is substantially less than a gate oxide thickness of the second transistor.

Statement 20. An integrated circuit as in statement 16, wherein the integrated circuit comprises a cache, and wherein the cache comprises the circuit for storing information.

It should be understood that all circuitry described herein may be implemented either in silicon or another semiconductor material or alternatively by software code representation of silicon or another semiconductor material.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and FIGURE are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for providing an integrated circuit, the integrated circuit having a circuit for storing information, the method comprising:
   providing a storing portion of the circuit which stores information, the storing portion comprising a first transistor;
   providing a write portion of the circuit which provides the information to be written to the storing portion, the write portion comprising a second transistor; and
   providing a read portion of the circuit which receives the information to be read from the storing portion, the read portion comprising a third transistor,
   wherein a ratio of a gate oxide thickness of the third transistor to a gate oxide thickness of the first transistor is less than or equal to 5/6.

2. A method as in claim 1, wherein the ratio of the gate oxide thickness of the third transistor to the gate oxide thickness of the first transistor is less than or equal to 2/3.

3. A method as in claim 1, wherein the ratio of the gate oxide thickness of the third transistor to the gate oxide thickness of the first transistor is less than or equal to 3/4.

4. A method as in claim 1, wherein the gate oxide thickness of the third transistor is less than or equal to 1.4 nanometers, and the gate oxide thickness of the first transistor is greater than or equal to 1.7 nanometers.

5. A method as in claim 1, wherein the gate oxide thickness of the third transistor is substantially less than a gate oxide thickness of the second transistor.

6. A method as in claim 1, wherein the integrated circuit comprises a cache, and wherein the cache comprises the circuit.

7. A method as in claim 1, wherein the integrated circuit comprises a register array, and wherein the register array comprises the circuit.

8. A method as in claim 1, wherein the read portion comprises a fourth transistor, and wherein a gate oxide thickness of the fourth transistor is substantially less than the gate oxide thickness of the first transistor.

9. A circuit, comprising:
   a cross-coupled latch which stores information, the cross-coupled latch comprising a first plurality of transistors;
   a differential write port, coupled to the cross-coupled latch, the differential write port being used to write a data value to the cross-coupled latch, the differential write port comprising a write transistor; and
   a single-ended read port, coupled to the cross-coupled latch, the single-ended read port being used to read the data value from the cross-coupled latch, the single-ended read port comprising a read transistor,
   wherein a ratio of a gate oxide thickness of the read transistor to a gate oxide thickness of at least one of the plurality of transistors is less than or equal to 5/6.

10. A circuit, comprising:
    a cross-coupled latch which stores information, the cross-coupled latch comprising a first plurality of transistors;
    a differential write port, coupled to the cross-coupled latch, the differential write port being used to write a data value to the cross-coupled latch, the differential write port comprising a write transistor;
    a single-ended read port, coupled to the cross-coupled latch, the single-ended read port being used to read the data value from the cross-coupled latch, the single-ended read port comprising a read transistor,
    wherein a gate oxide thickness of the read transistor is substantially less than a gate oxide thickness of at least one of the plurality of transistors; and
    an additional read port coupled to the cross-coupled latch, the additional read port being used to read the data value from the cross-coupled latch, the additional read port comprising an additional read transistor, wherein a gate oxide thickness of the additional read transistor is substantially less than the gate oxide thickness of the at least one of the plurality of transistors.

11. A circuit as in claim 10, wherein a ratio of the gate oxide thickness of the read transistor to the gate oxide thickness of the at least one of the plurality of transistors is less than or equal to 5/6.

12. A circuit as in claim 9, wherein the ratio of the gate oxide thickness of the read transistor to the gate oxide thickness of the at least one of the plurality of transistors is less than or equal to 3/4.

13. A circuit as in claim 9, wherein the gate oxide thickness of the read transistor is substantially less than a gate oxide thickness of the write transistor.

14. An integrated circuit comprising a cache, wherein the cache comprises the circuit as in claim 9.

15. An integrated circuit comprising a register, wherein the register comprises the circuit as in claim 9.

16. An integrated circuit having a circuit for storing information, the circuit for storing information comprising:
- a storing portion which stores the information, the storing portion comprising a first transistor;
- a write portion which provides the information to be written to the storing portion, the write portion comprising a second transistor; and
- a read portion which receives the information to be read from the storing portion, the read portion comprising a third transistor,
- wherein a ratio of a gate oxide thickness of the third transistor to a gate oxide thickness of the first transistor is less than or equal to 5/6.

17. An integrated circuit as in claim 16, wherein the ratio of the gate oxide thickness of the third transistor to the gate oxide thickness of the first transistor is less than or equal to 2/3.

18. An integrated circuit as in claim 16, wherein the ratio of the gate oxide thickness of the third transistor to the gate oxide thickness of the first transistor is less than or equal to 3/4.

19. An integrated circuit as in claim 16, wherein the gate oxide thickness of the third transistor is substantially less than a gate oxide thickness of the second transistor.

20. An integrated circuit as in claim 16, wherein the integrated circuit comprises a cache, and wherein the cache comprises the circuit for storing information.

* * * * *